United States Patent
Kim et al.

(10) Patent No.: US 7,256,143 B2
(45) Date of Patent: Aug. 14, 2007

(54) SEMICONDUCTOR DEVICE HAVING SELF-ALIGNED CONTACT PLUG AND METHOD FOR FABRICATING THE SAME

(75) Inventors: Myeong-Cheol Kim, Suwon (KR); Chang-Jin Kang, Suwon (KR); Kyeong-Koo Chi, Seoul (KR); Seung-Young Son, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/058,670

(22) Filed: Feb. 15, 2005

(65) Prior Publication Data

US 2005/0158948 A1    Jul. 21, 2005

Related U.S. Application Data

(62) Division of application No. 10/625,027, filed on Jul. 22, 2003, now Pat. No. 6,875,690.

(30) Foreign Application Priority Data

Dec. 12, 2002    (KR) .............................. 2002-79114

(51) Int. Cl.
*H01L 21/31*    (2006.01)
(52) U.S. Cl. .................. 438/774; 438/621; 438/758; 438/773
(58) Field of Classification Search ................ 257/621, 257/758, 773, 774
See application file for complete search history.

(56) References Cited

U.S. PATENT DOCUMENTS

| | | | |
|---|---|---|---|
| 6,391,736 B1 * | 5/2002 | Uh et al. ..................... | 438/396 |
| 6,730,570 B2 * | 5/2004 | Shin et al. ................... | 438/299 |
| 2003/0127677 A1 * | 7/2003 | Park et al. .................. | 257/300 |
| 2004/0188806 A1 * | 9/2004 | Chung et al. ............... | 257/621 |

* cited by examiner

*Primary Examiner*—Mary Wilczewski
*Assistant Examiner*—Pamela E Perkins
(74) *Attorney, Agent, or Firm*—F. Chau & Assoc., LLC

(57) ABSTRACT

Provided are a semiconductor device having a self-aligned contact plug and a method of fabricating the semiconductor device. The semiconductor device includes conductive patterns, a first interlayer insulating layer, a first spacer, a second interlayer insulating layer, and a contact plug. In each conductive pattern, a conductive layer and a capping layer are sequentially deposited on an insulating layer over a semiconductor substrate. The first interlayer insulating layer fills spaces between the conductive patterns and has a height such that when the first interlayer insulating layer is placed on the insulating layer, the first interlayer insulating layer is lower than a top surface of the capping layer but higher than a top surface of the conductive layer. The first spacer surrounds the outer surface of the capping layer on the first interlayer insulating layer. The second interlayer insulating layer covers the first interlayer insulating layer, the capping layer, and the first spacer and has a planarized top surface. The contact plug passes through the second interlayer insulating layer, the first interlayer insulating layer, and the insulating layer between the conductive patterns, is electrically connected to the semiconductor substrate, has an outerwall surrounded by a second spacer, and is self-aligned with the capping layer.

8 Claims, 9 Drawing Sheets

SEMICONDUCTOR DEVICE HAVING SELF-ALIGNED CONTACT PLUG AND METHOD FOR FABRICATING THE SAME

CROSS-REFERENCE TO RELATED APPLICATION

This application is a Divisional of U.S. application Ser. No. 10/625,027 filed on Jul. 22, 2003 now U.S. Pat. No. 6,875,690, the disclosure of which in its entirety is incorporated herein by reference.

BACKGROUND OF THE INVENTION

1. Field of the Invention

The present invention relates to a semiconductor device and a method for fabricating same, and more particularly, to a semiconductor device having conductive layers which are adjacent and parallel to one another and a contact plug which is formed between the conductive layers and a method for fabricating same.

2. Description of the Related Art

As semiconductor devices become highly integrated, there have been efforts to form many elements and wiring configurations in a limited area. In an example of such efforts, a capacitor is formed such that the capacitor is positioned over a bitline (COB) in a dynamic random access memory (DRAM) device. In the DRAM device, a metal-oxide seimconductor (MOS) transistor is formed on a substrate, and a capacitor is formed over a bitline, which outputs a data signal to a source. In addition, the capacitor is connected to a drain. Thus, such a capacitor structure needs a smaller area than when the capacitor is directly formed on the substrate.

In order to achieve such a capacitor structure, a plurality of contacts, e.g., a via contact or a contact plug, are required as a vertical conductive path which connects elements with other elements or elements with wires on different layers. Moreover, the contacts should be formed in a region so as to avoid bitlines serving as another conductive path. Thus, in order to form these contacts in a region other than the pre-existing conductive layer (e.g., bitline), the conductive layer is often coated with an insulating material having a different etching selectivity than the conductive layer and a self-aligned contact hole is formed by etching the insulating material. Here, the contact plug, which is formed by filling a conductive material in the self-aligned contact hole, will be referred to as a self aligned contact (SAC).

Figure 1:
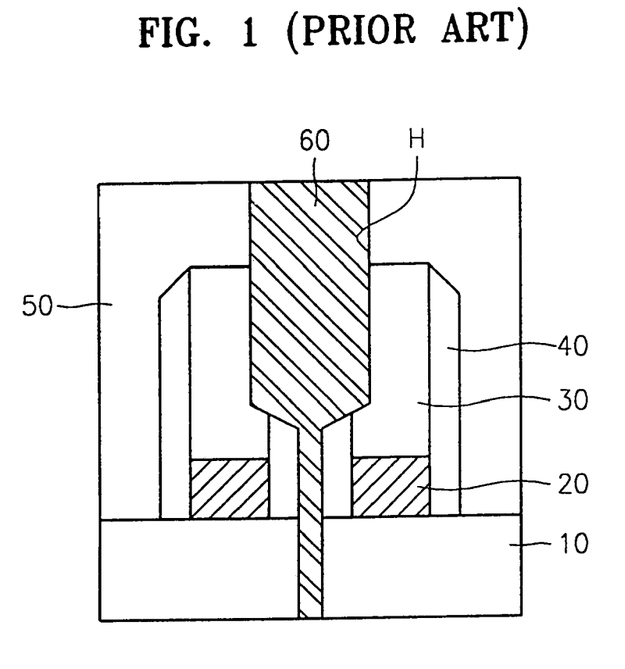
FIGS. 1 through 3 are vertical sectional views showing a configuration of bitlines in a conventional semiconductor device.
Figure 2:
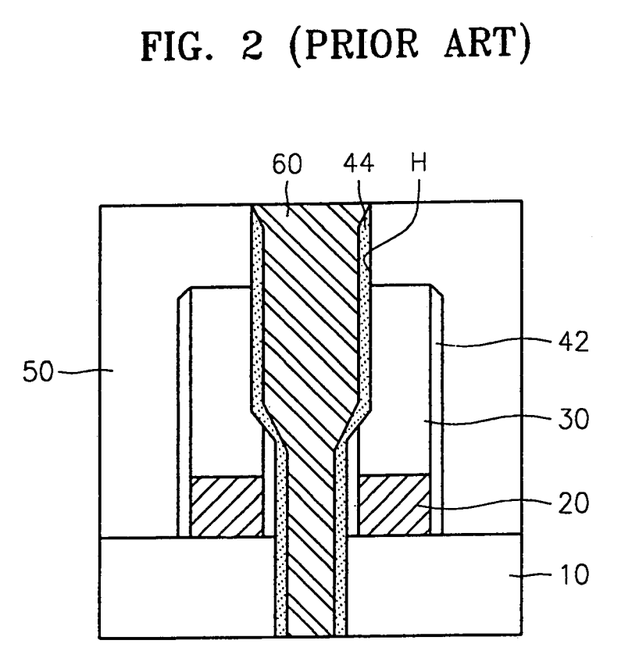
Figure 3:
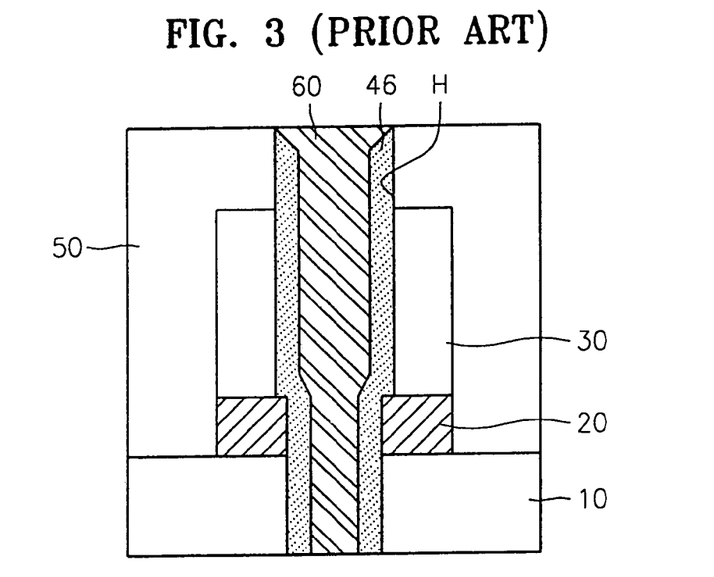

FIGS. 1 through 3 are vertical sectional views of bitlines showing a peripheral configuration of the bitlines in a conventional semiconductor device.

Referring to FIG. 1, two bitlines 20 are formed in parallel to each other. A storage node contact plug 60 is formed as an SAC between the bitlines 20 to electrically connect a contact pad or a drain region (not shown) under the bitlines 20 with a storage node (not shown) over the bitlines 20. A width of an entrance of the storage node contact plug 60 is larger than or equal to the distance between the bitlines 20. Capping layers 30 or spacers 40 are used to protect the bitlines 20 and if the capping layers 30 and spacers 40 are not formed, the bitlines 20 may be damaged during the formation of a contact hole H. Moreover, a short of the bitlines 20 and the conductive material that fills the contact hole H to form the storage node contact plug 60, may occur, thereby causing an abnormal function of the semiconductor device.

In an attempt to solve such a problem, a recent study used a capping layer 30 formed of silicon nitride and spacers 40 to surround the bitlines 20. Since interlayer insulating layers 10 and 50, in which the contact hole H is formed, are formed of silicon oxide, the interlayer insulating layers 10 and 50 have a different etching selectivity from the silicon nitride of the capping layer 30 when the interlayer insulating layers 10 and 50 are etched to form the contact hole H. Therefore, during formation of the contact hole H, most of the capping layer 30 and the spacers 40 exposed during the etching process remain while the interlayer insulating layers 10 and 50 between the spacers 40 are completely removed, and thus resulting in the formation of the contact hole H.

However, since a thick spacer 40 is used to prevent shorting of the bitlines 20 and the storage node contact plug 60, it is difficult to fill a space between the bitlines 20 with the interlayer insulating layer 50. That is, silicon oxide is deposited in a small space between the bitlines 20, but the space between the bitlines 20 is not fully filled with the silicon oxide. This results in the formation of a void inside the interlayer insulating layer 50 or a seam on the surface of the interlayer insulating layer 50. The void or the seam causes an error during a photo process or a contact hole H that is not fully open after the contact hole H's formation. In addition, since the spacer 40 is thick, an open area of the contact hole H becomes small, resulting in the contact hole H wherein it is difficult to reduce resistance.

FIG. 2 represents a case where two types of spacers 42 and 44 are applied. Under a strict design rule, a first spacer 42 would have to be very thin. Therefore, during the contact hole H formation, the first spacer 42 is recessed up to an upper portion of the bitlines 20 by etching the interlayer insulating layers 10 and 50. Accordingly, even when a second spacer 44 is formed in an of the contact hole H, the contact hole H is vulnerable to short-circuiting of the storage node contact plug 60 and the bitlines 20. If the second spacer 44 is thickened so as to prevent such shorting, the open area of the contact hole H becomes small, which makes it difficult to reduce a contact resistance.

Meanwhile, FIG. 3 shows a method of forming the contact hole H without forming spacers at the sidewalls of the bitlines 20 and forming a spacer 46 in the innerwall of the contact hole H. However, since there is no spacer which prevents the bitlines 20 from being etched during the contact hole H's formation, it is very difficult to prevent short-circuiting of the storage node contact plug 60 and the bitlines 20 if a misalignment of the contact hole H and the bitlines 20 occurs.

SUMMARY OF THE INVENTION

The present invention provides a semiconductor device which has conductive layers such as bitlines adjacent to one another and formed in parallel and a self-aligned contact (SAC) plug formed between the conductive layers, thereby reducing a chance of a short occurring between the conductive layers and the SAC.

The present invention also provides a method of fabricating a semiconductor device in which a self-aligned contact (SAC) plug can be formed between conductive layers, without a chance of a short occurring between the conductive layers and the SAC.

According to an aspect of the present invention, there is a semiconductor device which includes conductive patterns, each conductive pattern including a conductive layer and a capping layer sequentially stacked on an insulating layer over a semiconductor substrate. A first interlayer insulating layer fills spaces between the conductive patterns and has a height such that the first interlayer insulating layer is lower than a top surface of the capping layer but higher than a top surface of the conductive layer. That is, the first interlayer insulating layer has a height which reaches half of the capping layer's height. A first spacer surrounds an outer surface of the capping layer on the first interlayer insulating layer. There is a second interlayer insulating layer on the first interlayer insulating layer, which covers the first interlayer insulating layer, the capping layer, and the first spacer and has a planarized top surface. The first spacer is positioned between the first and second interlayer insulating layers and protects the capping layer from the top surface to the mid-height of the capping layer. A contact plug, which passes through the second interlayer insulating layer, the first interlayer insulating layer, and the insulating layer between the conductive patterns, is electrically connected to the semiconductor substrate, has an outerwall surrounded by a second spacer, and is self-aligned with the capping layer.

The insulating layer, the first interlayer insulating layer, and the second interlayer insulating layer may be formed of silicon oxide. The capping layer, the first spacer, and the second spacer may be formed of silicon nitride. A width of the conductive layer may be approximately 90 nm, a width of the top surface of the contact plug including the second spacer may be approximately 120 nm, a width of the second spacer may be approximately 300 Å, a height of the first spacer may be approximately 500 Å, and a width of the first spacer may be within the range of 200-300 Å.

In an embodiment of the present invention, the conductive layers may be bitlines, the contact plug may be a storage node contact plug which connects a storage electrode with a cell pad connected to the semiconductor substrate or with the semiconductor substrate. A top surface and a bottom surface of the first interlayer insulating layer may be flat. A top surface of the first interlayer insulating layer between the conductive patterns may be in the shape of V, and a bottom surface of the first spacer contacting the top surface of the first interlayer insulating layer may be inclined.

According to another aspect of the present invention, there is provided a method of fabricating a semiconductor device, which includes forming conductive patterns by sequentially depositing and patterning a conductive layer and a capping layer on an insulating layer disposed on a semiconductor substrate. The method also includes filling a space between the conductive patterns by depositing a first interlayer insulating layer, and exposing a part of a sidewall of the capping layer by wet etching the first interlayer insulating layer without causing a damage to the capping layer. A first spacer is formed at the sidewall of the exposed capping layer, and a second interlayer insulating layer is formed on the first interlayer insulating layer, the capping layer and the first spacer and a top surface of the second interlayer insulating layer is planaraized. A contact hole, which is self-aligned with the capping layer, is formed by dry etching the second interlayer insulating layer, the first interlayer insulating layer, and the insulating layer between the conductive patterns, and a second spacer is formed in the innerwall of the contact hole. A contact plug, which is electrically connected to the semiconductor substrate, is formed by filling the contact hole where the second spacer is formed with conductive material.

When a part of sidewall of the capping layer is exposed, the first interlayer insulating layer may be wet etched such that a top surface of the conductive layer is not exposed. The first spacer may have a width and a height such that the first spacer is removed by etching when the contact hole is formed.

The space between the conductive patterns may be completely filled by depositing the first insulating layer therein. The first interlayer insulating layer may be planarized by using the capping layer as a stopper. Alternatively, the space between the conductive patterns may be filled by forming a profile of the first interlayer insulating layer between the conductive patterns in the shape of V by depositing the first interlayer insulating layer using high-density plasma-chemical vapor deposition (HDP-CVD). In this case, the first interlayer insulating layer may not be planarized.

BRIEF DESCRIPTION OF THE DRAWINGS

Preferred embodiments of the present invention can be understood in more detail from the following descriptions taken in conjunction with the accompanying drawings in which.

DETAILED DESCRIPTION OF THE PREFERRED EMBODIMENTS

Preferred embodiments of the present invention will be described below in more detail with reference to the accompanying drawings. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the size of elements may be exaggerated for clarity. Like reference numerals have been used, where possible, to designate like elements throughout the specification.

Figure 4:
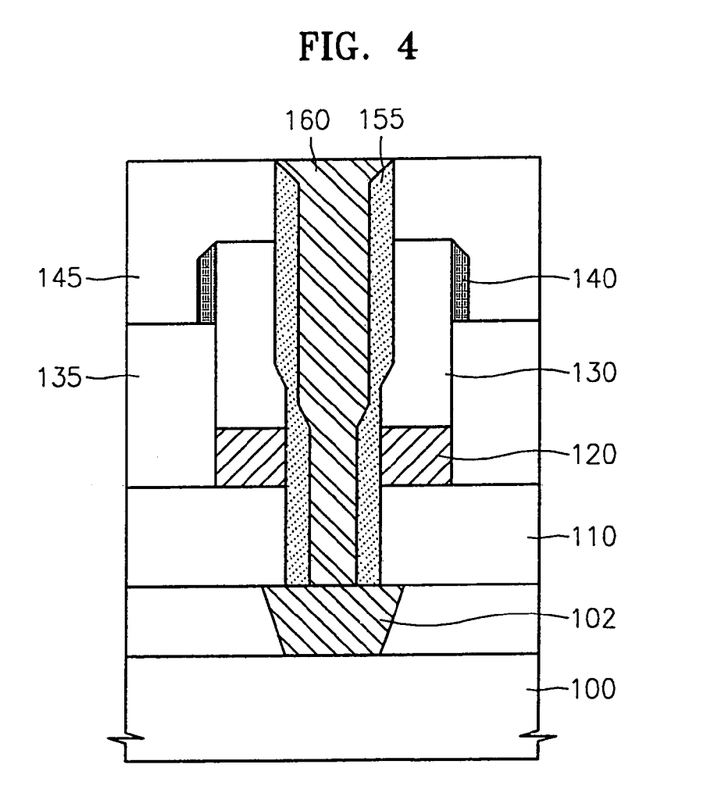
FIG. 4 is a sectional view of a semiconductor device having a self-aligned contact (SAC) plug according to a first embodiment of the present invention.

FIG. 4 is a sectional view of a semiconductor device having a self-aligned contact (SAC) plug according to a first embodiment of the present invention.

Referring to FIG. 4, after a conductive layer 120 and a capping layer 130 are sequentially stacked on an insulating layer 110, which is disposed over a semiconductor substrate 100, conductive patterns are formed by patterning the stacked structure in the shape of lines and spaces. For example, the conductive layer 120 may be a bitline and be formed of doped polysilicon or tungsten, or a combination of doped polysilicon and tungsten silicide. If the conductive layer 120 is formed of tungsten, a barrier metal may be applied beneath the conductive layer 120. A first interlayer insulating layer 135 fills a space between the conductive patterns, has a thickness which is less than the capping layer 130, and greater than the conductive layer 120. For example, the first interlayer insulating layer 135 may have a thickness that is one-half of the thickness of the capping layer 130. A first spacer 140 is formed on the first interlayer insulating layer 135 to surround the capping layer 130. Since the top surface of the first interlayer insulating layer 135 is flat, the bottom surface of the first spacer 140 contacting the top surface of the first interlayer insulating layer 135 is also flat.

The first interlayer insulating layer 135, the capping layer 130, and the first spacer 140 are covered by a second interlayer insulating layer 145. A top surface of the second interlayer insulating layer 145 is flat. A self-aligned contact (SAC) plug 160, i.e., a storage node contact plug connecting a storage electrode (not shown) over the top surface of the capping layer 130 with a cell pad 102 contacting the semiconductor substrate 100, is formed between two sides of the capping layer 130. The self-aligned contact (SAC) plug 160 passes through the second interlayer insulating layer 145, the first interlayer insulating layer 135, and an insulating layer 110, and is electrically connected to the semiconductor substrate 100 through the cell pad 102. If the cell pad 102 was not included, the self-aligned contact plug 160 could be directly connected to the semiconductor substrate 100. The outerwalls of a contact plug 160 are surrounded by a second spacer 155, and the contact plug 160 is electrically insulated from the conductive layer 120. Preferably, the second spacer 155 contacts the conductive layer 120 to secure a sufficient contact area.

Preferably, the insulating layer 110, the first interlayer insulating layer 135, and the second interlayer insulating layer 145 are formed of silicon oxide, and the capping layer 130, the first spacer 140, and the second spacer 155 are formed of silicon nitride. However, the capping layer 130, the first spacer 140, and the second spacer 155 may be formed of silicon oxynitride.

If a width of the conductive layer 120 is approximately 90 nm, and a width of a top surface of the contact plug 160 including the second spacer 155 is approximately 120 nm, a width of the second spacer 155 may be about 300 Å. It is preferable that a height and a width of the first spacer 140 are respectively approximately 500 Å, and 200-300 Å. The thickness of the insulating layer 110 may be approximately 1500 Å, and the thickness of the conductive layer 120 may be approximately 600 Å. The thickness of the capping layer 130 may be approximately 2000 Å. It is preferable that the thickness of the second interlayer insulating layer 145 is 2000 Å.

As shown in FIG. 4, the bottom surface of the first spacer 140, functioning as a complementary spacer of the second spacer 155, may be positioned at a mid-point along the height of the capping layer 130. Thus, it is possible to minimize a recess of the capping layer 130 when the contact hole is etched to form the contact plug 160, and it is possible to prevent a short between the contact plug 160 and the conductive layer 120. In addition, the first spacer 140 is positioned on the outerwall of the capping layer 130. Since the space between conductive layers 120 is completely open, resistance errors may be prevented. Even when the second spacer 155 is relatively thick, a contact resistance is not increased because an open area i.e., the space between the conductive layers 120, is large enough. Therefore, it is possible to reduce/eliminate shorts between the contact plug 160 and the conductive layer 120 by forming a thick second spacer 155 while maintaining a low contact resistance at a desired level.

Figure 5:
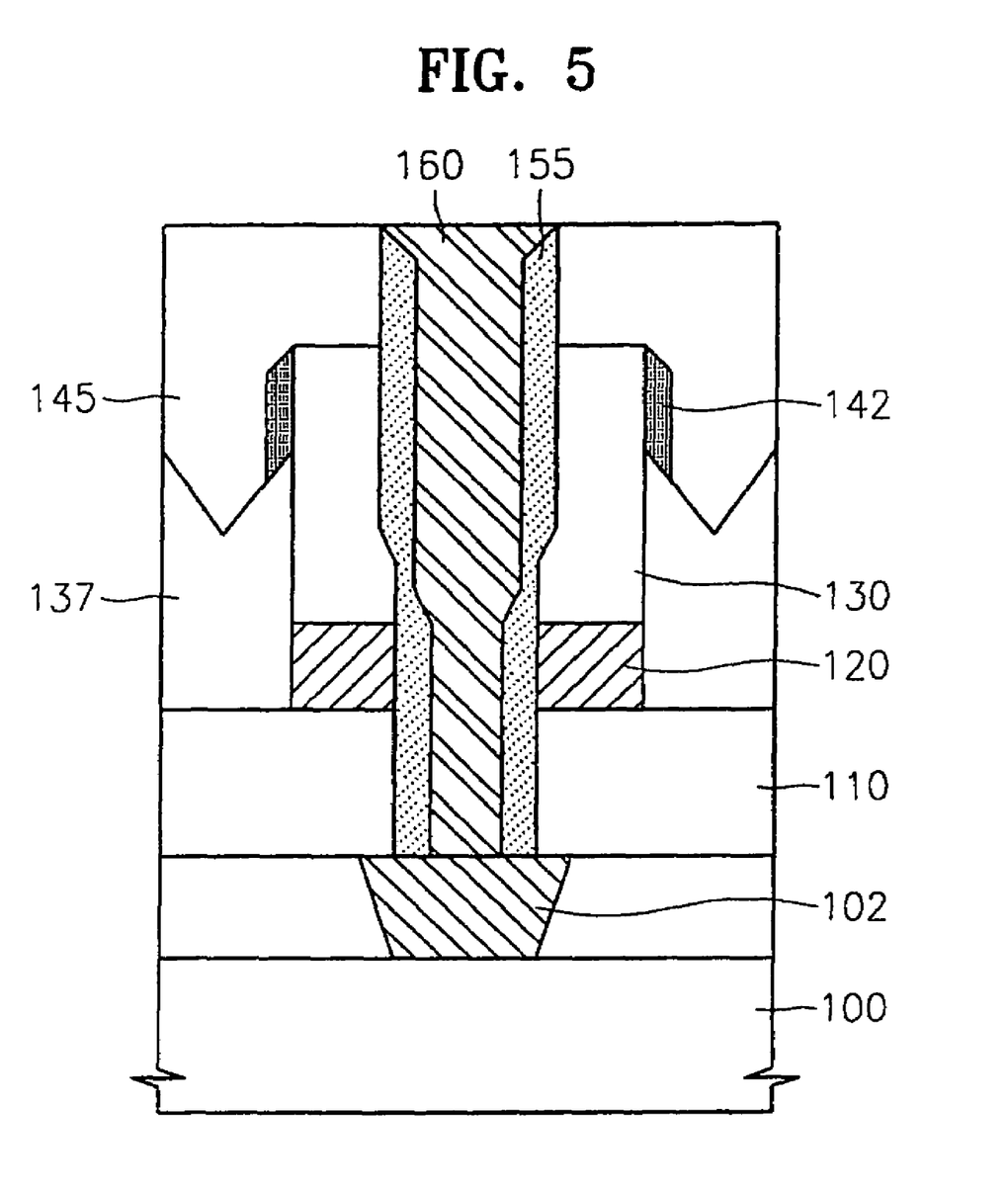
FIG. 5 is a sectional view of a semiconductor device having a self-aligned contact (SAC) plug according to a second embodiment of the present invention.

FIG. 5 is a sectional view of a semiconductor device having a self-aligned contact (SAC) plug according to a second embodiment of the present invention. Since a top surface of a first interlayer insulating layer 137 is in the shape of V, a bottom surface of a first spacer 142 contacting the top surface of the first interlayer insulating layer 137 is slanted to fit with the top surface of the first interlayer insulating layer 137. Except for the slanted bottom surface of the first spacer 142, the remaining elements of the semiconductor of FIG. 5 are similar to the first embodiment as described above.

FIGS. 6 through 12 are sectional views for illustrating a method of fabricating the semiconductor device including the self-aligned contact plug of FIG. 4 according to the first embodiment of the present invention.

Figure 6:
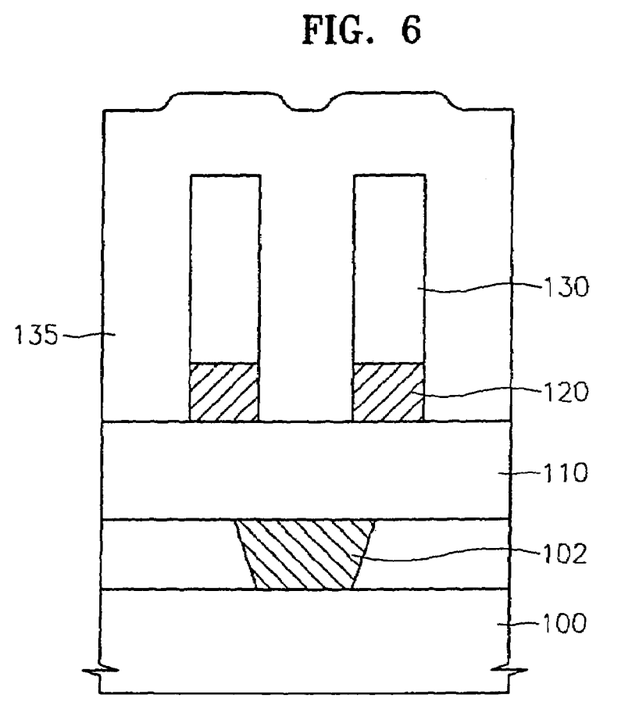
FIGS. 6 through 12 are sectional views for illustrating a method of fabricating the semiconductor device of FIG. 4.

Referring to FIG. 6, an insulating layer is deposited on the semiconductor substrate 100, and the cell pad 102 is formed in the insulating layer, so that the cell pad 102 contacts an impurity region such as a drain region (not shown) of the semiconductor substrate 100. Then, another insulating layer 110 is formed having a thickness of approximately 1500 Å on the semiconductor substrate 100. A conductive layer 120 is formed by depositing a conductive material on the insulating layer 110. The conductive material may be doped polysilicon, tungsten, or a combination of the doped polysilicon and tungsten silicide. A barrier metal formed of Ti/TiN may cover the insulating layer 110 prior to a deposition of tungsten on the insulating layer 110. A capping layer 130 is formed on the conductive layer 120 by depositing silicon nitride on the conductive layer 120, using plasma enhanced chemical vapor deposition (PECVD) or low pressure chemical vapor deposition (LPCVD). The reaction temperature of 500-850° C. of $SiH_4$ and $NH_3$ may be useful in depositing the silicon nitride. Silicon oxynitride may be substituted for the silicon nitride. The silicon oxynitride and the silicon nitride have etching selectivities which are different from that of silicon oxide.

A conductive pattern, whereby the conductive layer 120 and the capping layer 130 are stacked and patterned, is formed by applying anisotropic etching sequentially to the capping layer 130 and the conductive layer 120, in the shape of a line and space by using a photolithography process. Here, the conductive layer 120 is a bitline. If a width of the conductive layer 120 is 90 nm and the thickness of the conductive layer 120 is 600 Å, it is preferable that the thickness of the capping layer 130 be approximately 2000 Å. Silicon oxide is deposited on the entire surface of a resultant structure by using chemical vapor deposition (CVD). A first interlayer insulating layer 135 is formed having a thickness that is enough to completely fill the space between the conductive patterns. Here, since silicon oxide is deposited before any spacer is formed at the side of the conductive patterns, it is possible to easily fill the space between conductive patternss without forming a void. The first interlayer insulating layer 135 can be formed by using PECVD or plasma-enhanced tetraethylorthosilicate (PETEOS) as well as CVD. When PECVD is used, a reaction of $SiH_4$ and $O_2$ (or $N_2O$) is used. When PETEOS is used, a reaction of TEOS [$Si(OC_2H_5)_4$] and $O_2$ (or $O_3$) is used.

Figure 7:
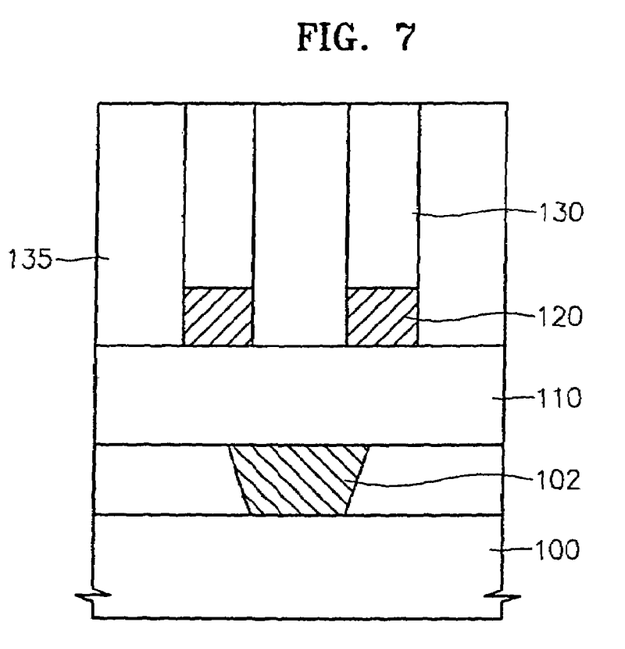

Next, the top surface of the first interlayer insulating layer 135 is planarized by using chemical mechanical polishing (CMP) until the capping layer 130 is exposed. The first interlayer insulating layer 135: is formed of silicon oxide, and the capping layer 130 is formed of silicon nitride or silicon oxynitride. Thus, the capping layer 130 may be used as a CMP stopper, i.e., an ending point of the planarization since the silicon nitride or silicon oxynitride and the silicon oxide require different polishing speeds. The top surface of the first interlayer insulating layer 135 may be planarized by etching back as well as CMP. If the first interlayer insulating layer 135 has good fluidity, it may be planarized by reflow.

Figure 8:
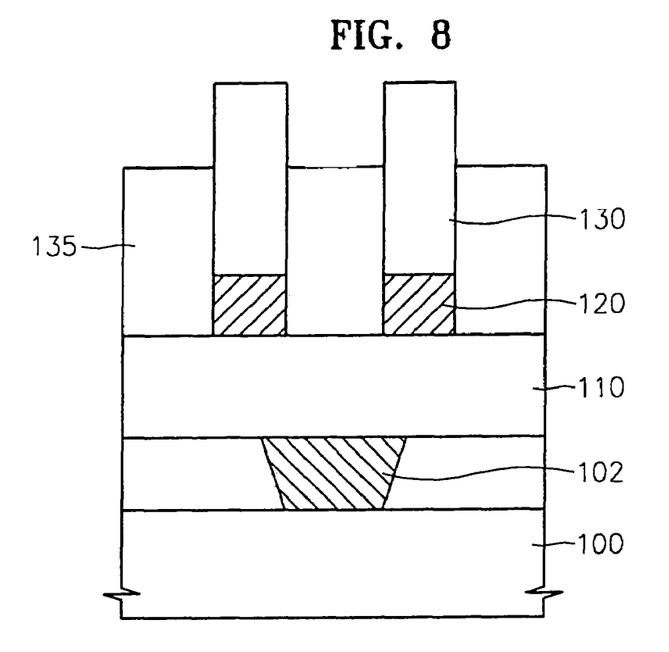

Referring FIG. 8, the first interlayer insulating layer 135 is removed by wet etching using a silicon oxide etching solution until its top surface is level with the mid-height of the capping layer 130 without causing damage to the capping layer 130. The wet etching is isotropy etching. If a hydrofluoric acid (HF) solution having the desired etching selectivity is used as the silicon oxide etching solution, it is possible to etch the first interlayer insulating layer 135 while maintaining the top surface of the first interlayer insulating layer 135 at a height lower than a top surface of the capping layer 130 but higher than a top surface of the conductive layer 120, e.g., at the mid-height of the capping layer 130, and maintaining the top surface of the first insulating layer 135 as a flat profile. For example, the first interlayer insulating layer 135 may be etched to approximately 500 Å from the top surface of the capping layer 130. Thus, parts of the sidewalls of the capping layer 130 are exposed, but the top surface of the conductive layer 120 is not exposed. A mixed solution of ammonia ($NH_4OH$), hydrogen peroxide ($H_2O_2$), and deionized water may be used as an etching solution instead of the hydrofluoric acid (HF) solution.

Figure 9:
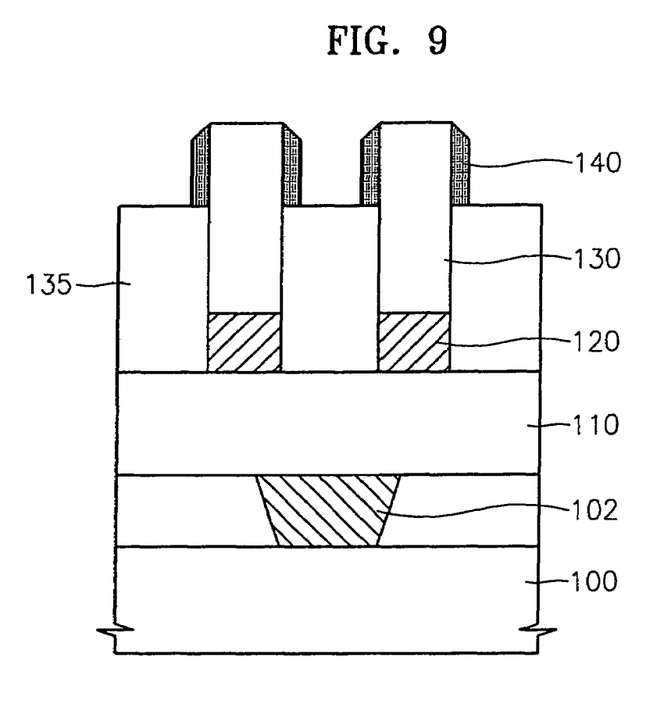

Referring to FIG. 9, silicon nitride or silicon oxynitride is deposited as an insulating layer for a spacer on the resultant structure of FIG. 8 at a predetermined thickness by using PECVD or LPCVD. Then, a first spacer 140 is formed on the exposed sidewall of the capping layer 130 by applying anisotropic plasma etching to the insulating layer. The insulating layer is etched until a top surface of the first interlayer insulating layer 135 is exposed. Since the capping layer 130 is formed of silicon nitride or silicon oxynitride, it may be partially etched to some insignificant extent. The first spacer 140 is used as a shoulder to protect the conductive layer 120 and the capping layer 130 when a contact hole is formed later. Preferably, the first spacer 140 has a width which can be completely removed when a contact hole is etched. For example, if a top surface of the contact hole has a width of approximately 120 nm, the first spacer 140 has a width of 200-300 Å. Since the first spacer 140 is formed on the first interlayer insulating layer 135 which is planarized by wet etching, a bottom surface of the first spacer 140 is flat.

Figure 10:
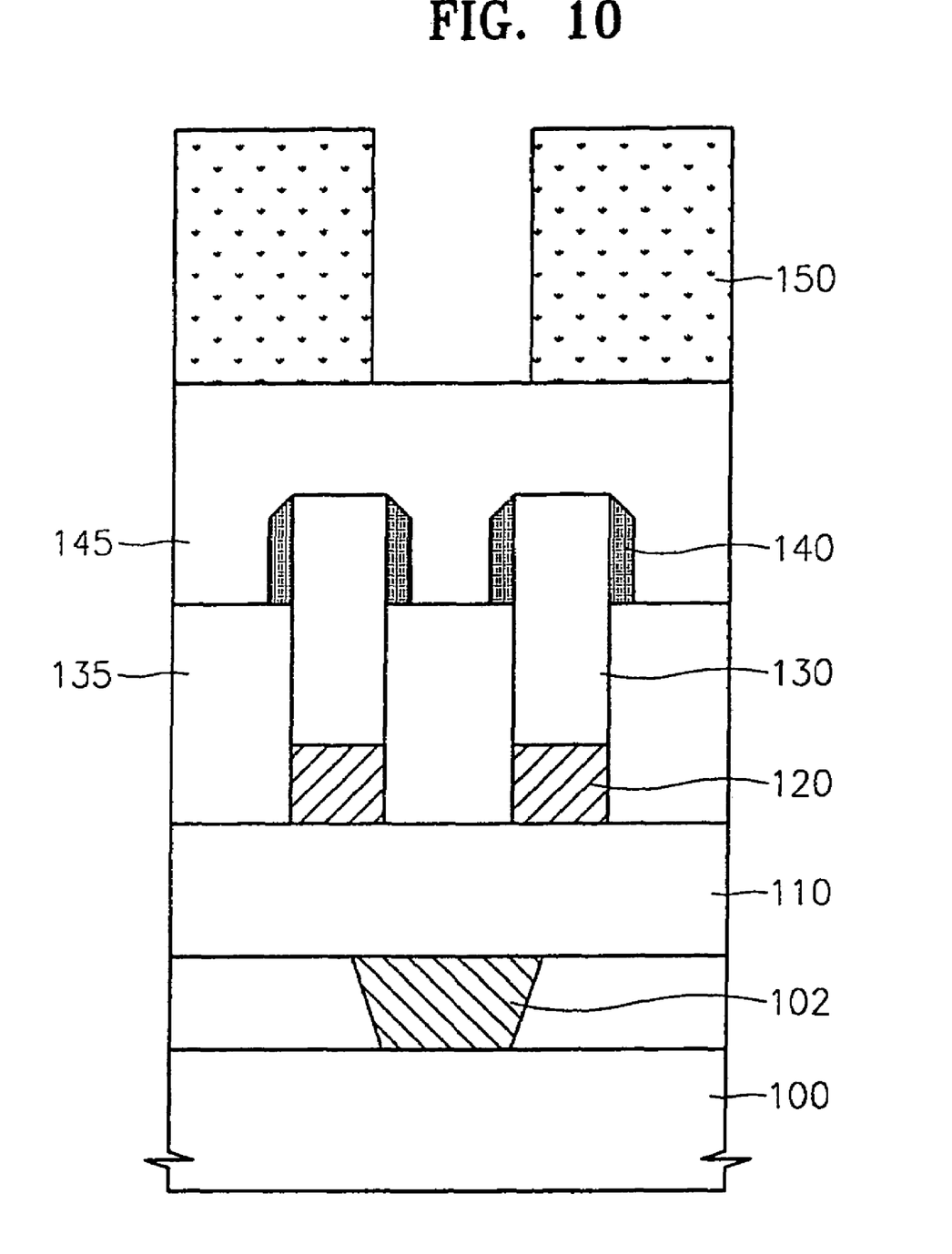

Referring to FIG. 10, the second interlayer insulating layer 145 is formed by depositing silicon oxide on the entire surface of a resultant structure where the first spacer 140 is formed. Then, the CMP process is applied to the second interlayer insulating layer 145 to planarize a surface of the second interlayer insulating layer 145 and to facilitate formation of the contact hole. A photoresist pattern 150 is formed on the second interlayer insulating layer 145 to define an opening portion which exposes an area where the contact hole is formed by using a photo process. The opening portion has a width larger than a distance between the conductive layers 120. For example, the opening portion may have a width of approximately 120 nm.

Figure 11:
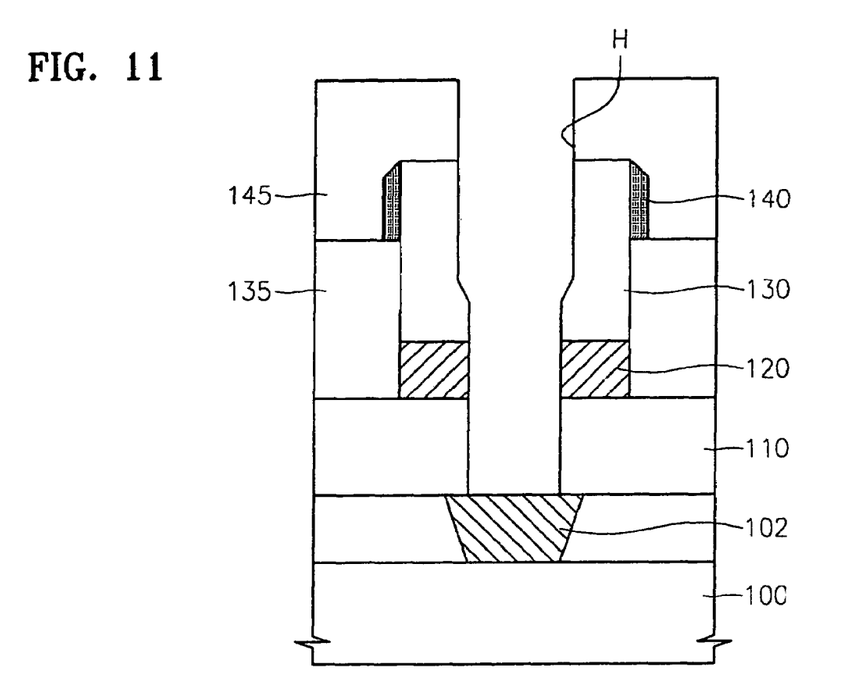

Referring to FIG. 11, the second interlayer insulating layer 145, the first interlayer insulating layer 135, and the insulating layer 110 are sequentially anisotropically etched by using the photoresist pattern 150 as an etching mask. Thus, a contact hole H which exposes the cell pad 102 between the conductive patterns is formed. The anisotropic etching may be performed by using a gas made by adding $CH_3F$, $C_2H_2$, $CH_2F_2$, Ar, He, Xe, Ne to $C_4H_8/C_3H_8$, $C_3F_6$, $C_2F_4$, $C_2HF_5$. When the second interlayer insulating layer 145 is etched, the capping layer 130 and the first spacer 140 are used as an etching mask. The contact hole H is formed while being self-aligned with the capping layer 130 and the first spacer 140. In particular, the first spacer 140 remains at the sidewall of the capping layer 130 to minimize the recess of the capping layer 130. When the first interlayer insulating layer 135 is etched, the first spacer 140 is gradually removed, thus the width and the height of the first spacer 140 begin to decrease. However, since the first spacer 140 keeps protecting the sidewall of the capping layer 130, the etching is performed while the contact hole H is self-aligned with the capping layer 130 and the first spacer 140. When the cell pad 102 is exposed, the first spacer 140 is completely removed. Thus, the contact hole H is formed between the capping layers 130 while being self-aligned with the capping layer 130, and thus the space between the conductive patterns is completely opened. The first spacer 140 prevents the recess from occurring in the capping layer 130 and assures an open area large enough for the contact hole H by being completely removed. Preferably, the contact hole H has a large width to expose sides of the conductive layer 120. Since the recess of the capping layer 130 is minimized, the damage to the conductive layer 120 can be reduced. In addition, since an open area large enough for the contact hole H is assured, resistance errors can be prevented.

Polymer remnants created during an etching process are removed by using $O_2$, $CO_2$, or CO. The photoresist pattern 150 is removed by a strip after the contact hole H is formed.

Figure 12:
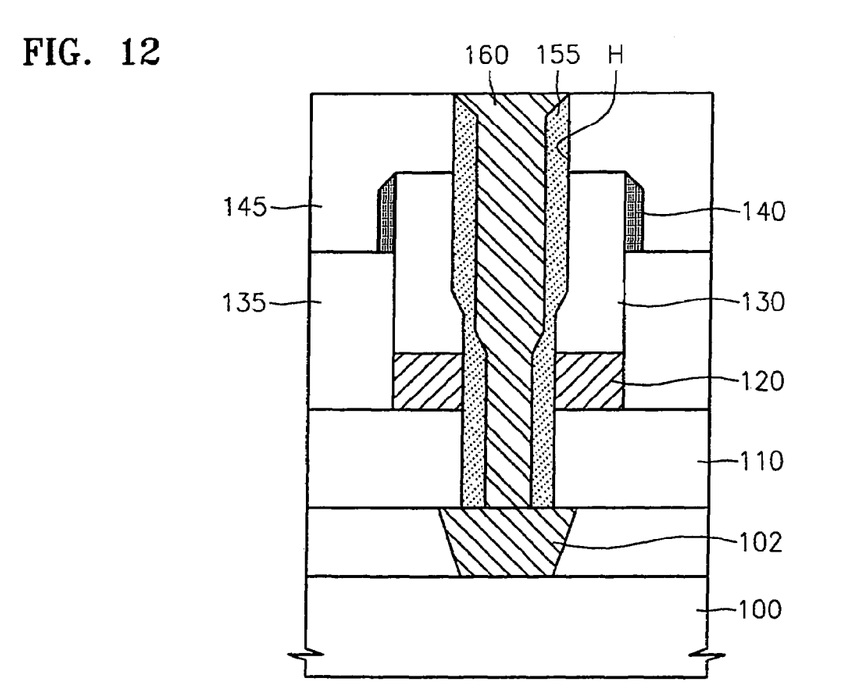

Referring to FIG. 12, a second spacer 155 is formed in the innerwall of the contact hole H by depositing silicon nitride or silicon oxynitride and performing anisotropic plasma etching. The second spacer 155 insulates the conductive layer 120 and conductive materials filling the contact hole H. Since the open area large enough for the contact hole H is assured by completely removing the first spacer 140, it is possible to form the second spacer 155 to have a relatively thick width of 300 Å. The contact plug 160 is formed, which is electrically connected to a semiconductor substrate 100 through the cell pad 102 by filling the contact hole H with conductive material. For example, after doped polysilicon is deposited in the contact hole H, polysilicon on the second interlayer insulating layer 145 is removed by planarizing the top surface of the contact hole H, using etching back or CMP. Thus, the contact plug 160 is formed by exposing a top surface of the second interlayer insulating layer 145.

Therefore, if the contact hole H is formed after the first spacer 140 has been formed at the mid-height of the capping layer 130, the first spacer 140 minimizes the recess of the capping layer 30, and then an open area large enough for the contact hole H is assured after the first spacer 140 is removed. Thus, according to the present invention, the probability of a short between a self-aligned contact plug and a conductive layer is reduced, and a contact resistance can be reduced. In addition, since silicon oxide is deposited in a space between the conductive patterns before spacers are formed on the sidewalls of the conductive patterns, it is possible to prevent the development of a void and to facilitate deposition of the silicon oxide.

FIGS. 13 through 16 are sectional views illustrating a method of fabricating a semiconductor device having a self-aligned contact plug according to a second embodiment of the present invention.

Figure 13:
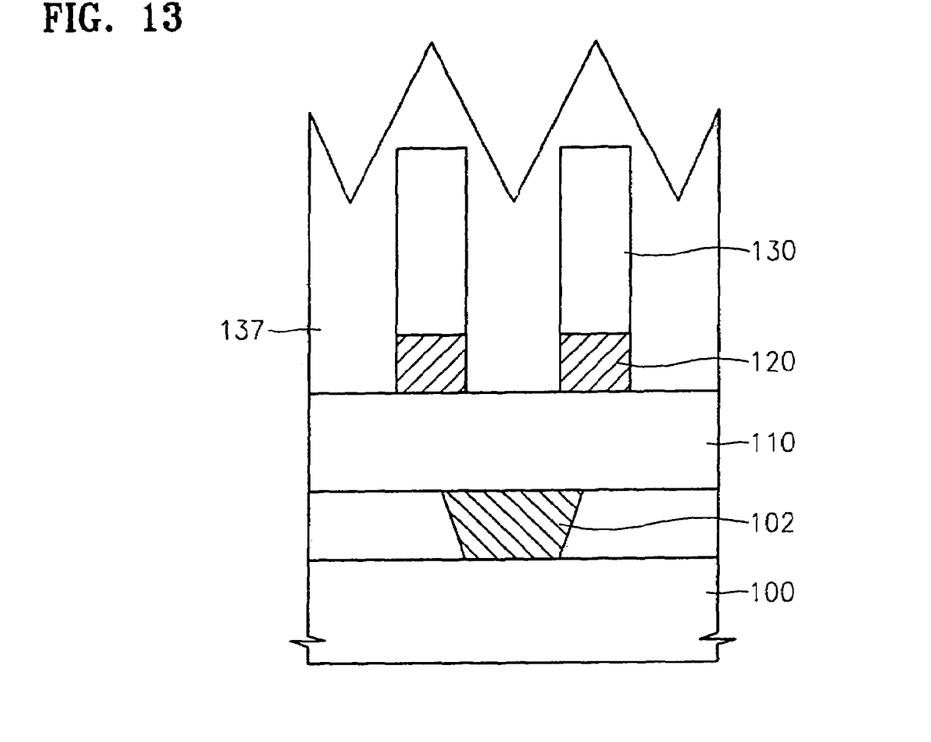
FIGS. 13 through 16 are sectional views for illustrating a method of fabricating the semiconductor device of FIG. 5.

Referring to FIG. 13, an insulating layer is deposited on the semiconductor substrate 100 to form a cell pad 102 in the insulating layer. Another insulating layer 110 having a thickness of approximately 1500 Å is formed on the insulating layer over the semiconductor substrate 100. The conductive layer 120 is formed by depositing conductive materials on the insulating layer 110. The capping layer 130 formed of silicon nitride or silicon oxynitride is formed on the conductive layer 120. After that, the conductive patterns are formed by anisotropically etching the capping layer 130 and the conductive layer 120 in the shape of lines and spaces by using the photolithography process where the conductive layer 120 and the capping layer 130 are stacked and patterned.

Silicon oxide is deposited on the entire surface of the resultant structure by using high density plasma-chemical vapor deposition (HDP-CVD). Here, since silicon oxide is deposited before any spacer is formed at the sides of the conductive patterns, it is possible to prevent formation of a void and to facilitate deposition of the silicon oxide. In addition, due to the use of HDP-CVD, much silicon oxide may be deposited on the conductive patterns while the conductive patterns have grooves therebetween. That is, the first interlayer insulating layer 137 has a profile in the shape of V between the conductive patterns.

As known to those skilled in the art, HDP-CVD is created by using both CVD and etching, using a sputtering method. With HDP-CVD, a deposition gas used to deposit a material layer and a sputtering gas used to etch the material layer are supplied to a chamber. Therefore, when the silicon oxide is deposited, $SiH_4$ and $O_2$ are supplied to the chamber as a deposition gas, and an inert gas, e.g., Ar, can be supplied as the sputtering gas to the chamber. The deposition gas and the sputtering gas are partially ionized due to plasma induced in the chamber by a high frequency power.

Since biased power having a high frequency is applied to a wafer chuck, e.g., electrostatic chuck, in the chamber which loads a semiconductor substrate, ionized deposition and sputtering gases are accelerated to a surface of the semiconductor substrate. The accelerated deposition gas ion forms silicon oxide and the accelerated sputtering gas ion sputters on the deposited silicon oxide.

The silicon oxide is simultaneously deposited and sputtered on, but the deposition speed is higher than the sputtering speed. Thus, the silicon oxide fills the space between the conductive patterns. However, a speed at which the silicon oxide is etched by the sputtering gas ion, e.g., $Ar^+$, may be three or four times less than the deposition speed. Therefore, a profile of the top surface of the silicon oxide layer is in the shape of V. However, the shape of the profile can be changed by controlling a source power for generating the plasma, a bias power having a high frequency applied to the wafer chuck on which the substrate is loaded, an amount of supply of the deposition gas, or an amount of supply of the sputtering gas. For example, the source power in a device performing the HDP-CVD process can range from 3000 W to 5000 W, and the biased power applied to the wafer chuck can range from 800 W to 1000 W. The amount of the silicon source gas, e.g., $SiH_4$, can range from 30 sccm to 150 sccm. The amount of the oxygen source gas, e.g., $O_2$, can range from 60 sccm to 200 sccm. The amount of the sputtering gas, e.g., Ar, can range from 20 sccm to 400 sccm.

Figure 14:
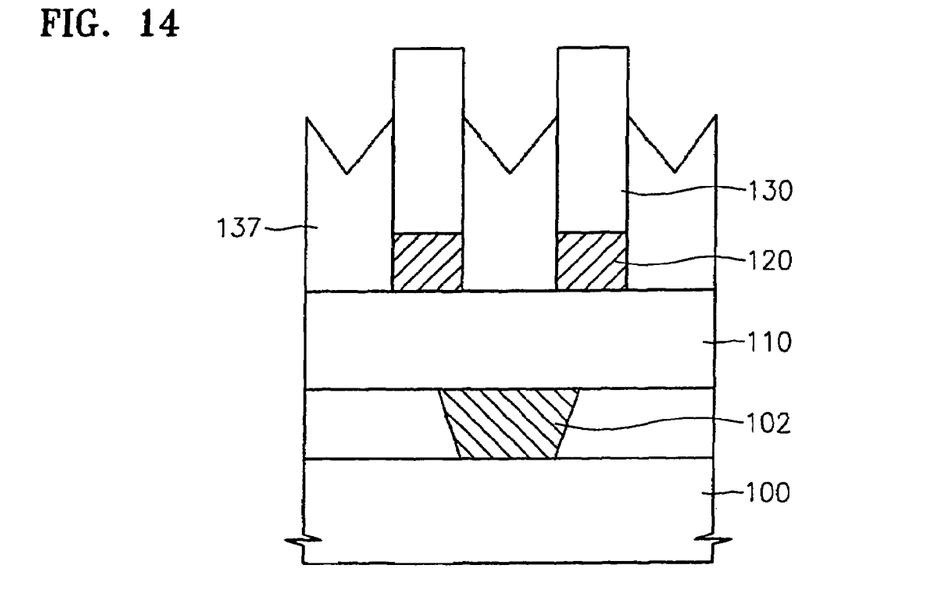

Referring to FIG. 14, the first interlayer insulating layer 137 is wet etched until its top surface is level with the mid-height of the capping layer 130 without causing damage to the capping layer 130. The process of wet etching includes applying a silicon oxide etching solution to the first interlayer insulating layer 137. Since wet etching shows an isotrpic characteristic, a profile of the first interlayer insulating layer 137 has the shape of V even when the first interlayer insulating layer 137 is lowered to the middle of the capping layer 130. The capping layer 130 is etched such that the sidewalls of the capping layer 130 are exposed to a depth of 500 Å.

Figure 15:
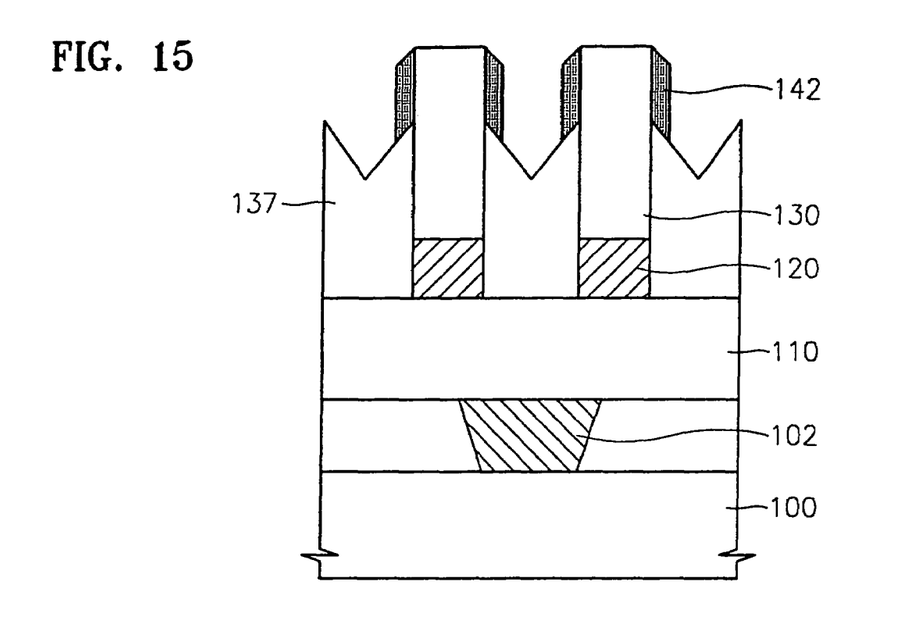
Figure 16:
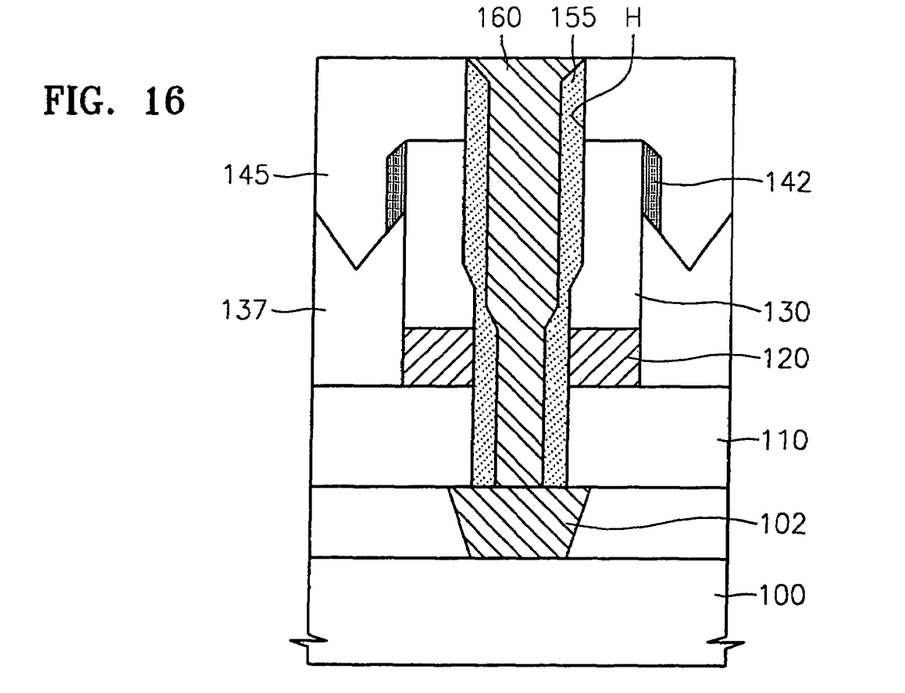

Referring to FIG. 15, silicon nitride or silicon oxynitride is deposited on a resultant structure of FIG. 14 as an insulating layer for a spacer at a predetermined thickness by using LPCVD. The first spacer 142 is formed at the sidewall of the capping layer 130, which is exposed by performing anisotropic plasma etching on the insulating layer. Since the profile of the first interlayer insulating layer 137 between the conductive patterns is in the shape of V, a bottom surface of the first spacer 142 contacting the top surface of the first interlayer insulating layer 137 is inclined at a predetermined angle.

Descriptions omitted in the second embodiment can be referred to the descriptions of the first embodiment. A process following the above descriptions for the second embodiment is similar to the first embodiment. Accordingly, the contact plug 160 electrically connected to the semiconductor substrate 100 is formed by filling the contact hole H with conductive material after forming the second spacer 155 in the innerwall of the contact hole H. The second spacer 155 is created by etching the first interlayer insulating layer 137 and the insulating layer 110.

As described above, if a contact hole is formed after a first spacer is formed so as to protect an upper portion of the capping layer, the first spacer minimizes the recess of the capping layer and an open area large enough for a contact hole is assured after the first spacer is removed. Therefore, according to the present invention, an occurrence of a short between a contact plug and a conductive layer can be prevented, and the contact resistance can be reduced. Thus, an operating characteristic of a semiconductor device can be improved. In addition, since silicon oxide is deposited to fill a space between conductive patterns before any spacer is formed on the sidewalls of the conductive patterns, it is possible to prevent formation of a void and to facilitate deposition of the silicon oxide.

Although illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A semiconductor device comprising:
 a plurality of conductive patterns, each conductive pattern including a conductive layer and a capping layer stacked on an insulating layer disposed on a semiconductor substrate;
 a first interlayer insulating layer filling at least one space between at least two adjacent conductive patterns and having a height whereby when disposed on the insulating layer, a top surface of the first interlayer insulating layer is lower than a top surface of the capping layer and higher than a top surface of the conductive layer;
 a first spacer disposed on the first interlayer insulating layer and surrounding an outer surface of the capping layer;
 a second interlayer insulating layer covering the first interlayer insulating layer, the capping layer, and the first spacer and having a planarized top surface; and
 a contact plug passing through the second interlayer insulating layer, the first interlayer insulating layer, and the insulating layer, wherein the contact plug is positioned between the at least two conductive patterns, is electrically connected to the semiconductor substrate, has an outerwall surrounded by a second spacer, and is self-aligned with the capping layer.

2. The semiconductor device of claim 1, wherein the insulating layer, the first interlayer insulating layer, and the second interlayer insulating layer are formed of silicon oxide, and the capping layer, the first spacer, and the second spacer are formed of silicon nitride.

3. The semiconductor device of claim 1, wherein a width of the conductive layer is approximately 90 nm, a width of the top surface of the contact plug including the second spacer is approximately 120 nm, a width of the second spacer is approximately 300 Å, a height of the first spacer is approximately 500 Å, and a width of the first spacer is within the range of 200-300 Å.

4. The semiconductor device of claim 1, wherein the conductive layer is a bitline, and the contact plug is a storage node contact plug connecting a storage electrode with one of a cell pad connected to the semiconductor substrate and the semiconductor substrate.

5. The semiconductor device of claim 1, wherein the top surface and a bottom surface of the first interlayer insulating layer are flat.

6. The semiconductor device of claim 1, wherein the top surface of the first interlayer insulating layer has a V shape, and a bottom surface of the first spacer contacting the top surface of the first interlayer insulating layer is inclined.

7. The semiconductor device of claim 1, wherein the second spacer contacts the conductive layer.

8. A semiconductor device comprising:

a plurality of conductive patterns, each conductive pattern including a conductive layer and a capping layer stacked on an insulating layer disposed on a semiconductor substrate;

a first interlayer insulating layer filling at least one space between at least two adjacent conductive patterns and having a height whereby when disposed on the insulating layer, a top surface of the first interlayer insulating layer is lower than a top surface of the capping layer and higher than a top surface of the conductive layer;

a first spacer disposed on the first interlayer insulating layer and surrounding an outer surface of the capping layer;

a second interlayer insulating layer covering the first interlayer insulating layer, the capping layer, and the first spacer; and a contact plug passing through the second interlayer insulating layer, the first interlayer insulating layer, and the insulating layer, wherein the contact plug is positioned between the at least two conductive patterns, includes an outerwall surrounded by a second spacer, and is self-aligned with the capping layer.

* * * * *